United States Patent
Xue et al.

(10) Patent No.: US 10,824,026 B2
(45) Date of Patent: Nov. 3, 2020

(54) SUBSTRATE AND PREPARATION METHOD THEREFOR, AND DISPLAY PANEL

(71) Applicants: BEIJING BOE DISPLAY TECHNOLOGY CO., LTD., Beijing (CN); BOE TECHNOLOGY GROUP CO., LTD., Beijing (CN)

(72) Inventors: Jie Xue, Beijing (CN); Qian Jiang, Beijing (CN); Xu Zhang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/300,163

(22) PCT Filed: Mar. 6, 2018

(86) PCT No.: PCT/CN2018/078106
§ 371 (c)(1),
(2) Date: Nov. 9, 2018

(87) PCT Pub. No.: WO2018/166375
PCT Pub. Date: Sep. 20, 2018

(65) Prior Publication Data
US 2019/0146259 A1 May 16, 2019

(30) Foreign Application Priority Data
Mar. 14, 2017 (CN) ..................... 2017 2 0244625 U

(51) Int. Cl.
*G02F 1/1339* (2006.01)
*G02F 1/1335* (2006.01)
(Continued)

(52) U.S. Cl.
CPC ........ *G02F 1/13394* (2013.01); *G02F 1/1333* (2013.01); *G02F 1/1339* (2013.01);
(Continued)

(58) Field of Classification Search
CPC ..... G03F 7/70216; G02F 2001/133388; G02F 1/133351; G02F 1/13394;
(Continued)

(56) References Cited

U.S. PATENT DOCUMENTS 5,943,113 A * 8/1999 Ichihashi ............... G02F 1/1341
349/126
2014/0300848 A1 * 10/2014 Mori ...................... G02F 1/1339
349/106
(Continued)

FOREIGN PATENT DOCUMENTS

CN 104111562 A 10/2014
CN 105116628 A 12/2015
(Continued)

OTHER PUBLICATIONS

International Search Report and Written Opinion in corresponding PCT Application No. PCT/CN2018/078106, dated Jun. 4, 2018 (an English translation attached hereto).

*Primary Examiner* — Michael H Caley
*Assistant Examiner* — Mariam Qureshi
(74) *Attorney, Agent, or Firm* — Leason Ellis LLP

(57) ABSTRACT

A substrate and a preparation method thereof, and a display panel are provided. The substrate includes a base substrate. The substrate includes a plurality of units, and a cutting region is between at least two adjacent units; the substrate further includes a first protruding portion, which is on the base substrate and in the cutting region; and a position of the first protruding portion corresponds to a position of an exposure gap measure window of a mask.

17 Claims, 6 Drawing Sheets

(51) Int. Cl.
  *G03F 7/20* (2006.01)
  *G02F 1/1333* (2006.01)
  *G03F 9/00* (2006.01)

(52) U.S. Cl.
  CPC .. *G02F 1/133512* (2013.01); *G02F 1/133516* (2013.01); *G03F 7/70216* (2013.01); *G03F 9/703* (2013.01); *G02F 1/133351* (2013.01); *G02F 2001/13396* (2013.01)

(58) Field of Classification Search
  CPC . G02F 2001/13396; G02F 2001/13398; G02F 2001/13625; G02F 2001/136231; G02F 2001/136236
  See application file for complete search history.

(56) References Cited

U.S. PATENT DOCUMENTS

2015/0293279 A1\* 10/2015 Pei ..................... G02B 5/201
                                                        359/891
2015/0362767 A1   12/2015 Zhao et al.
2018/0290443 A1\* 10/2018 Wild ................. B32B 37/1292
2018/0321535 A1\* 11/2018 Kim .................... G02F 1/13394

FOREIGN PATENT DOCUMENTS

| CN | 105204238 A | 12/2015 |
| CN | 105807484 A | 7/2016 |
| CN | 205992105 U | 3/2017 |
| CN | 206523720 U | 9/2017 |
| JP | 2003215600 A | 7/2003 |

\* cited by examiner

SUBSTRATE AND PREPARATION METHOD THEREFOR, AND DISPLAY PANEL

The present application is a U.S. National Stage Application under 35 U.S.C. § 371 of International Patent Application PCT/CN2018/078106 filed on Mar. 6, 2018, which claims priority of Chinese Patent Application No. 201720244625.1 filed on Mar. 14, 2017, both of which are incorporated herein by reference in their entireties as part of the present application.

TECHNICAL FIELD

Embodiments of the present disclosure relate to a substrate and a preparation method thereof, and a display panel.

BACKGROUND

A photolithography process is a common patterning process. The photolithography process for example comprises steps of: forming a film on a base substrate; coating a photoresist layer on the film; exposing and developing the photoresist layer with a mask to form a photoresist pattern; and etching the film with the photoresist pattern as a mask so that a desired pattern is formed by the film. In order to guarantee that the desired pattern is accurately formed, it is necessary to strictly control a distance between the mask and the base substrate in the above photolithography process. For example, an exposure gap measuring window is provided in the mask, and is used for measuring a distance between the mask and a surface of the base substrate during exposure.

SUMMARY

According to embodiments of the disclosure, a substrate is provided. The substrate comprises a base substrate. The substrate comprises a plurality of units, and a cutting region is between at least two adjacent units; the substrate further comprises a first protruding portion, which is on the base substrate and in the cutting region; and a position of the first protruding portion overlaps a position of an exposure gap measure window of a mask used during the substrate is exposed.

For example, each of the at least two adjacent units includes a display region; the substrate further comprises a spacer, which is on the base substrate and in the display region; and the first protruding portion and the spacer are in a same layer and formed with a same material.

For example, each of the at least two adjacent units includes a sealing region outside the display region and an intermediate region between the display region and the sealing region; the substrate further comprises a second protruding portion, which is on the base substrate and in the intermediate region; and the first protruding portion, the spacer and the second protruding portion are arranged in a same layer and formed with a same material.

For example, the substrate further comprises a black matrix and a color filter on the base substrate, and the black matrix includes a first portion and a second portion. The first portion of the black matrix and the color filter are between the base substrate and the spacer; and the second portion of the black matrix is between the base substrate and the second protruding portion.

For example, a distance from an end portion of the first protruding portion away from the base substrate to the base substrate, a distance from an end portion of the spacer away from the base substrate to the base substrate, and a distance from an end portion of the second protruding portion away from the base substrate to the base substrate are different from one another.

For example, a distance from an end portion of the first protruding portion away from the base substrate to the base substrate, a distance from an end portion of the spacer away from the base substrate to the base substrate, and a distance from an end portion of the second protruding portion away from the base substrate to the base substrate are same with one another.

For example, the at least two adjacent units are arranged in a row direction; and a plurality of first protruding portions are arranged in the cutting region between the at least two adjacent units, and the plurality of first protruding portions are arranged in a column direction.

For example, a height of the first protruding portion is 3.6 microns to 3.8 microns For example, the first protruding portion is transparent.

For example, a material of the first protruding portion is a photosensitive material.

According to the embodiments of the disclosure, a display panel is provided. The display panel comprises: the substrate as described above; an opposed substrate; and a sealant, which is between the substrate and the opposed substrate and bonds the substrate with the opposed substrate.

For example, each of the at least two adjacent units includes a display region and a sealing region outside the display region, and the sealant is arranged in the sealing region; the display panel further comprises an auxiliary sealant which is in a cutting region, and the first protruding portion is located between the sealant and the auxiliary sealant; and the sealant and the auxiliary sealant are arranged in a same layer and formed with a same material.

According to the embodiments of the disclosure, a preparation method of a substrate is provided. The substrate comprises a base substrate; the substrate comprises a plurality of units, and a cutting region is between at least two adjacent units; the method comprises: adopting a mask to expose the substrate so as to form a first protruding portion at a position of the base substrate overlapping a position of an exposure gap measure window of the mask, and the first protruding portion is in the cutting region.

For example, each of the at least two adjacent units includes a display region; the mask includes a spacer window; the method includes: adopting the mask to expose the substrate so as to form a spacer and the first protruding portion on the base substrate at the same time, a position of the spacer overlaps a position of the spacer window and the spacer is in the display region.

For example, each of the at least two adjacent units includes a sealing region outside the display region and an intermediate region between the display region and the sealing region; the mask includes a second protruding portion window; the method includes: adopting the mask to expose the substrate so as to form the spacer, the first protruding portions and a second protruding portion on the base substrate at the same time, a position of the second protruding portion overlaps a position of the second protruding portion window and the second protruding portion is in the intermediate region.

For example, the method further comprises: forming a black matrix and a color filter on the base substrate, and the black matrix including a first portion and a second portion. The first portion of the black matrix and the color filter are between the base substrate and the spacer; the second portion of the black matrix is between the base substrate and the second protruding portion.

For example, a light transmittance of the exposure gap measure window, a light transmittance of the spacer window and a light transmittance of the second protruding portion window are same with one another.

For example, a light transmittance of the exposure gap measure window is larger than a light transmittance of the second protruding portion window, and the light transmittance of the second protruding portion window is larger than the light transmittance of the spacer window.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
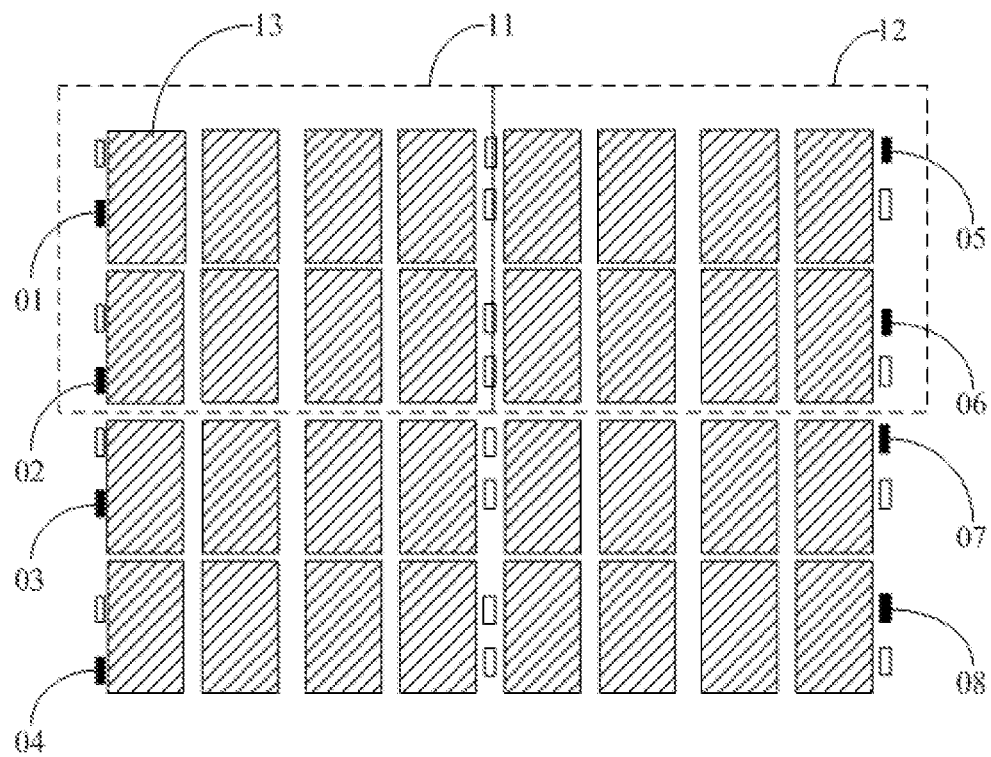
FIG. 1 is a schematic diagram of positions of a substrate after being exposed corresponding to exposure gap measure windows of a mask according to one technique.

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "up", "down", "left", "right" and the like are only used for expressing relative positional relationship, the relative positional relationship may be correspondingly changed in the case that the absolute position of a described object is changed.

Thicknesses of various films and layers and a size and a shape of a region in the drawings do not reflect a real size or shape, and just aim to schematically illustrate content of the embodiments of the present disclosure.

Figure 2:
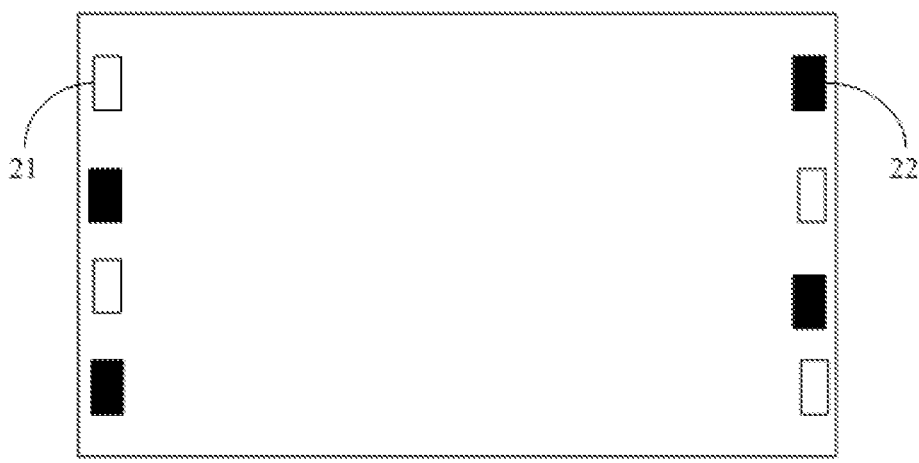
FIG. 2 is a schematic diagram of the exposure gap measure windows of the mask according to one technique.

As shown in FIG. 2, in order to achieve a narrow frame of a substrate, a mask adopted for exposing the substrate is designed as follows: besides designing unsymmetrical two groups of exposure gap measure windows 21, unopened regions 22 are also designed. As shown in FIG. 1 and FIG. 2, different regions of the substrate are exposed with the mask of FIG. 2. Positions of the windows 21 and the unopened regions 22 on the right side of the mask during a first exposure process 11 respectively coincide with positions of the unopened regions 22 and the windows 21 on the left side of the mask during a second exposure process 12. During the first exposure process 11, positions of the substrate corresponding to the unopened regions 22 of the mask do not form any pattern; and during the subsequent second exposure process 12, gap measuring for the second exposure process can be performed at these positions, and accordingly some pattern is formed at these positions.

However, such design results in that the pattern is not formed at eight regions from a region 01 to a region 08 of edges of the substrate in FIG. 1 because they are shielded from being exposed. So, during a display panel comprising the substrate is cut, the region 01 to the region 08 show insufficient support because of no any pattern formed, and thus the substrate deforms to cause stress accumulation, such that a stress cell gap difference is introduced due to the stress accumulation, resulting in a peripheral defect of the panel.

Figure 3:
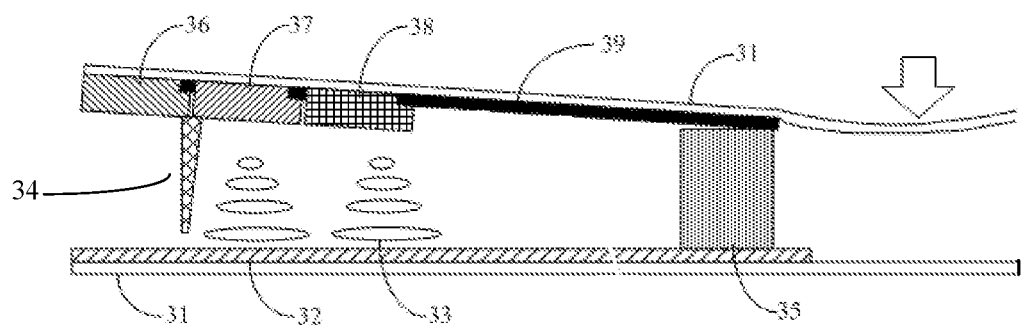
FIG. 3 is a structural schematic diagram obtained during a display panel is cut according to one technique.

For example, as shown in FIG. 3, during the display panel is cut, because no pattern is formed near a cutting position (a position shown by an arrow in FIG. 3), supporting force is insufficient, a color filter substrate deforms, the stress accumulation is generated, and the stress cell gap difference is introduced due to the stress accumulation. For example, in FIG. 3, the display panel comprises: an array substrate and the color filter substrate opposite to each other, a liquid crystal layer 33 and a spacer 34 located between the array substrate and the color filter substrate, and a sealant 35 sealing the array substrate and the color filter substrate. In FIG. 3, the array substrate is just illustrated to comprise a metal layer 32 located on a base substrate 31, and the color filter substrate is just illustrated to comprise a red (R) color filter 36, a green (G) color filter 37, a blue (B) color filter 38 and a black matrix 39 on another base substrate 31. For example, the substrate shown in FIG. 1 is the color filter substrate and/or the array substrate shown in FIG. 3.

Figure 4:
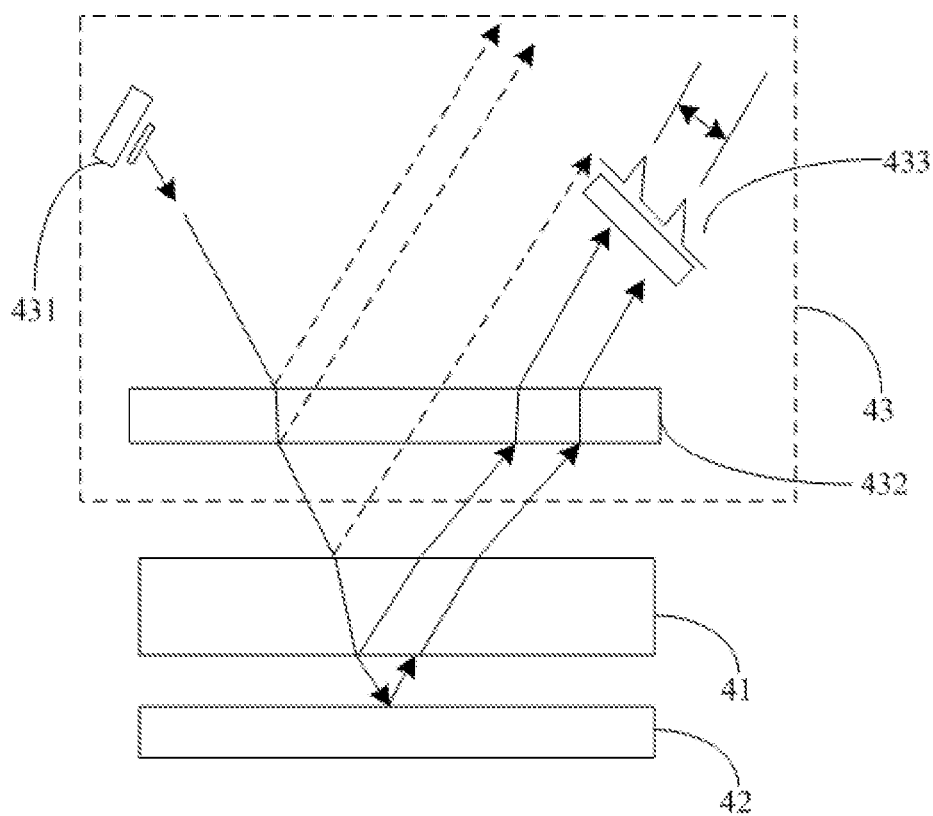
FIG. 4 is a schematic diagram of a principle for measuring a distance between the mask and the substrate during exposure.
Figure 5:
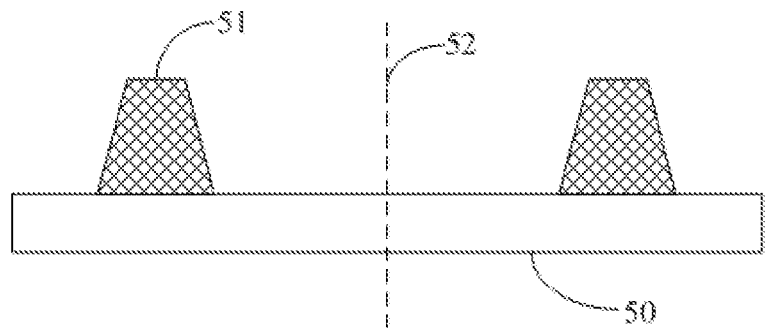
FIG. 5(a) and FIG. 5(b) are respectively structural schematic diagrams of a substrate provided by embodiments of the present disclosure.
Figure 5:
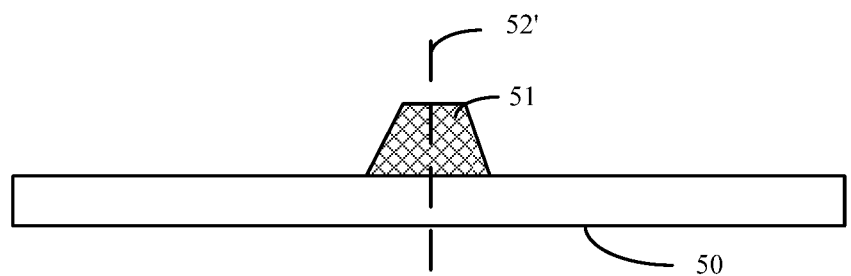
Figure 6:
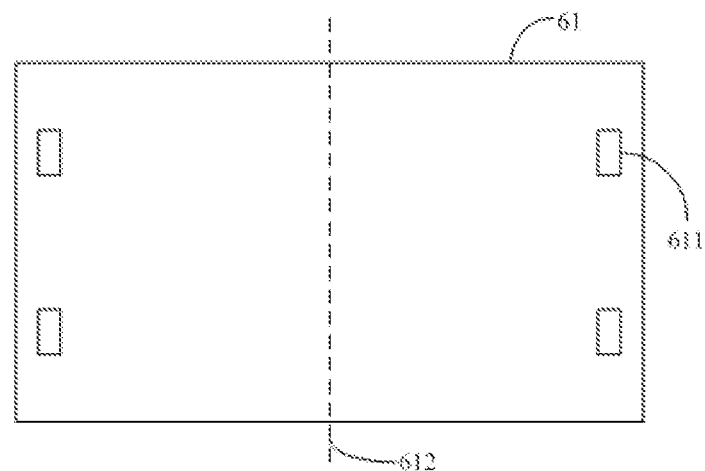
FIG. 6(a) and FIG. 6(b) are respectively schematic diagrams of a mask provided by the embodiments of the present disclosure.
Figure 6:
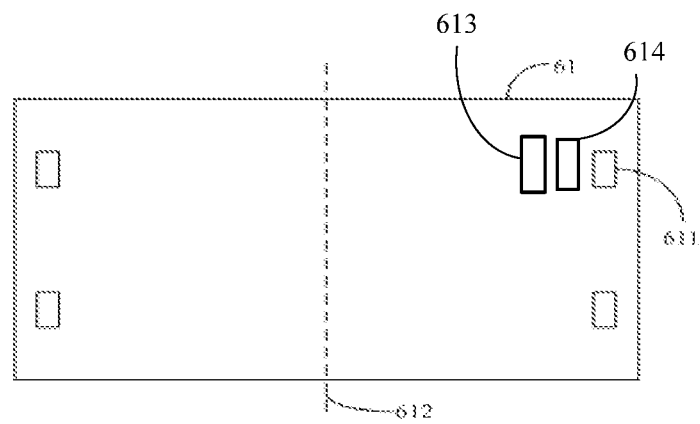

FIG. 4 is a principle schematic diagram for measuring the gap between the mask and the substrate during exposure. As shown in FIG. 4, an exposing machine takes an approaching type exposing machine as an example. The gap between the mask 41 and the substrate 42 during exposure is a key parameter for determining a size of the pattern formed after exposure. The gap between the mask 41 and the substrate 42 is measured by using an interference principle of light, for example, a charge coupled device (CCD) is used for capturing a light ray reflected by the mask 41 and a light ray reaching the substrate 42 through the exposure gap measure window of the mask 41 and reflected by the substrate 42, and according to an optical path difference of the two light rays, the gap between the mask 41 and the substrate 42 is obtained. In FIG. 4, a structural part 43 is adopted during the approaching type exposing machine measures the gap between the mask 41 and the substrate 42, the structural part 43 for example includes a light source 431 of an organic light emitting diode emitting white light, a negative pressure element 432 and a testing part such as the CCD. The negative pressure element 432 is for example a vacuum element, and applies an upward force to the mask 41 to prevent that the mask 41 droops downwards because of a gravity.

As shown from FIG. 5(a) to FIG. 8, embodiments of the present disclosure disclose a substrate, comprising a base substrate 50. The substrate comprises a plurality of units 80, and a cutting region is between at least two adjacent units 80; the substrate further comprises a first protruding portion 51, which is on the base substrate 50 and in the cutting region; and a position of the first protruding portion 51 overlaps a position of an exposure gap measure window 611 of a mask 61 used during the substrate is exposed.

FIG. 6(a) and FIG. 6(b) are respectively schematic diagrams of the mask provided by the embodiments of the present disclosure. In FIG. 6(a), in order to facilitate description, only the exposure gap measure window 611 is shown. In FIG. 6(b), in order to facilitate description, only the exposure gap measure window 611, and a spacer window 613 and a second protruding portion window 614 being about to be describe subsequently are shown. However, what needs to be explained is, the mask 61 may further have other patterns.

As shown in FIG. 6(a) and FIG. 6(b), in the embodiments of the present disclosure, the exposure gap measure windows 611 are symmetrical with respect to a central symmetry axis 612 of the mask 61.

The substrate in the embodiments of the present disclosure is provided with the first protruding portion 51, the position of the first protruding portion 51 overlaps the position of at least one exposure gap measure window 61 of the mask 61 used during the substrate is exposed, and therefore the first protruding portion 51 is formed while patterning is performed on a film on the substrate by using the mask 61, and thus no individual process is adopted to form the first protruding portion 51. In addition, the first protruding portion plays a supporting role, thereby reducing stress accumulation near a cutting position of a display panel and reducing a peripheral defect of the display panel.

For example, as shown in FIGS. 5(a) and 5(b), the substrate has a plurality of first protruding portions 51. For example, the plurality of first protruding portions 51 are symmetrically distributed and formed with respect to a central symmetry axis 52 of the substrate in a first direction. For example, some of the plurality of first protruding portions 51 are distributed on a central symmetry axis 52' of the substrate in a second direction, and the first direction is perpendicular to the second direction. In this way, the first protruding portion 51 plays the supporting role better.

For example, the mask as shown in FIG. 6(a) is adopted to expose different regions of the substrate, and an exposing process is as follows. The exposure gap measure window 611 is adopted to measure the gap between the mask 61 and the substrate, and a first exposure 81 is performed and the first protruding portion 51 is formed at a position of the substrate overlapping the exposure gap measure window 611; the mask is moved right, a position of the exposure gap measure window 611 on a left side of the mask is provided to coincide with a position (at which the first protruding portion 51 has been formed on the substrate) of the exposure gap measure window 611 on a right side of the mask that has been adopted during the first exposure 81; the exposure gap measure window 611 is adopt to measure the gap between the mask 61 and the substrate again; and then the exposure gap measure window 611 on the left side of the mask is shielded and a second exposure 82 is performed.

For example, a height of the first protruding portion 51 is 3.6 μm to 3.8 μm; and during the mask is adopted to expose the substrate, the gap between the mask and a surface of the substrate is at an order of hundred microns. Thus, during the gap between the mask 61 and the substrate is measured again by using the exposure gap measure window 611 before the second exposure is performed as mentioned above, the first protruding portion 51 that has been already formed in the first exposure process at the position overlapping the exposure gap measure window 61 does not affect the measurement accuracy of the gap. Thus, the embodiments of the present disclosure reduces the stress accumulation near the cutting position of the display panel and reduces the peripheral defect of the display panel on a premise that the measurement accuracy of the gap is not affected.

For example, the first protruding portion 51 is transparent. In this way, during the exposure gap measure window 611 is adopted to measure the gap between the mask 61 and the substrate again before the second exposure process is performed as mentioned above, the first protruding portion 51 existing at the position overlapping the exposure gap measure window 61 does not affect the measurement accuracy of the gap at all.

For example, a material of the first protruding portion 51 is a photosensitive material. For example, the material of the first protruding portion 51 is a transparent photosensitive organic material, such as photoresist. In this way, the first protruding portion 51 is formed just through exposing and developing without etching, and a manufacturing process is simplified.

As mentioned above, the mask is moved, such that the position of the exposure gap measure window 611 on the left side of the mask adopted during the second exposure 82 coincides with the position of the exposure gap measure window 611 on the right side of the mask adopted during the first exposure 81, and thus, a distance between the unit 80 formed through the first exposure 81 and the unit formed through the second exposure 82 is as small as possible, and a narrow frame is achieved easily.

Figure 7:
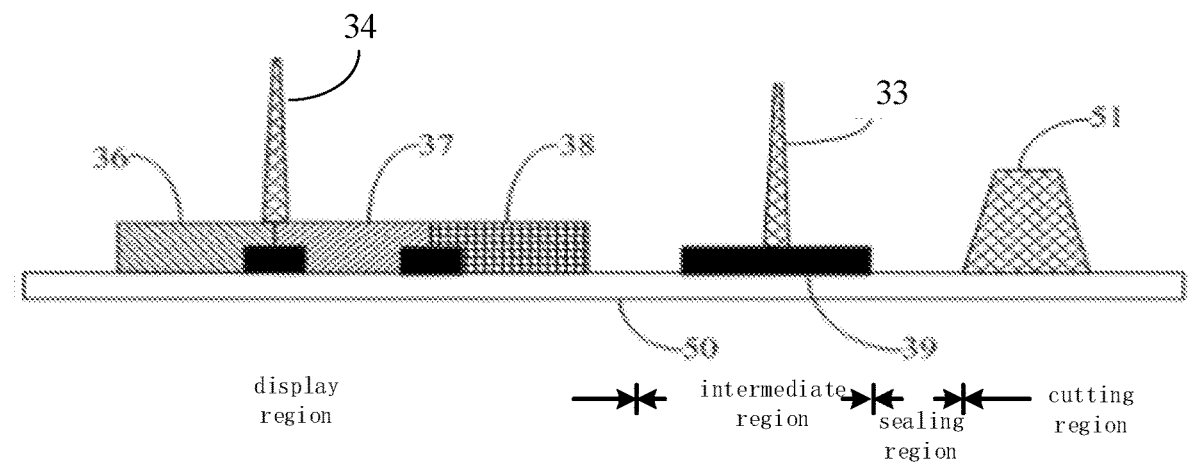
FIG. 7 is a more detailed structural schematic diagram of the substrate provided by the embodiments of the present disclosure.

For example, as shown in FIG. 7, the substrate in the embodiments of the present disclosure further comprises a black matrix 39, a color filter (for example, a red color filter 36, a green color filter 37 and a blue color filter 38) and a spacer 34 provided on the base substrate 50, that is to say, the substrate in the embodiments of the present disclosure is a color filter substrate. For example, in an actual production process, the substrate in the embodiments of the present disclosure is an array substrate, that is to say, the first protruding portion 51 is arranged on the array substrate. Various circuit boards are bound to the array substrate, and the array substrate is farther away from the cutting position than the color filter substrate, thus, in order to make the first protruding portion 51 play the supporting role better during cutting, preferably the first protruding portion 51 is arranged on the color filter substrate.

For example, the material of the first protruding portion 51 is the transparent photosensitive organic material, and the material of the first protruding portion 51 is same as that of the spacer 34. In this way, the first protruding portion 51 and the spacer 34 are manufactured in a same patterning process, so that material selecting cost of the first protruding portion 51 is reduced and a process of forming the substrate is simplified.

Figure 8:
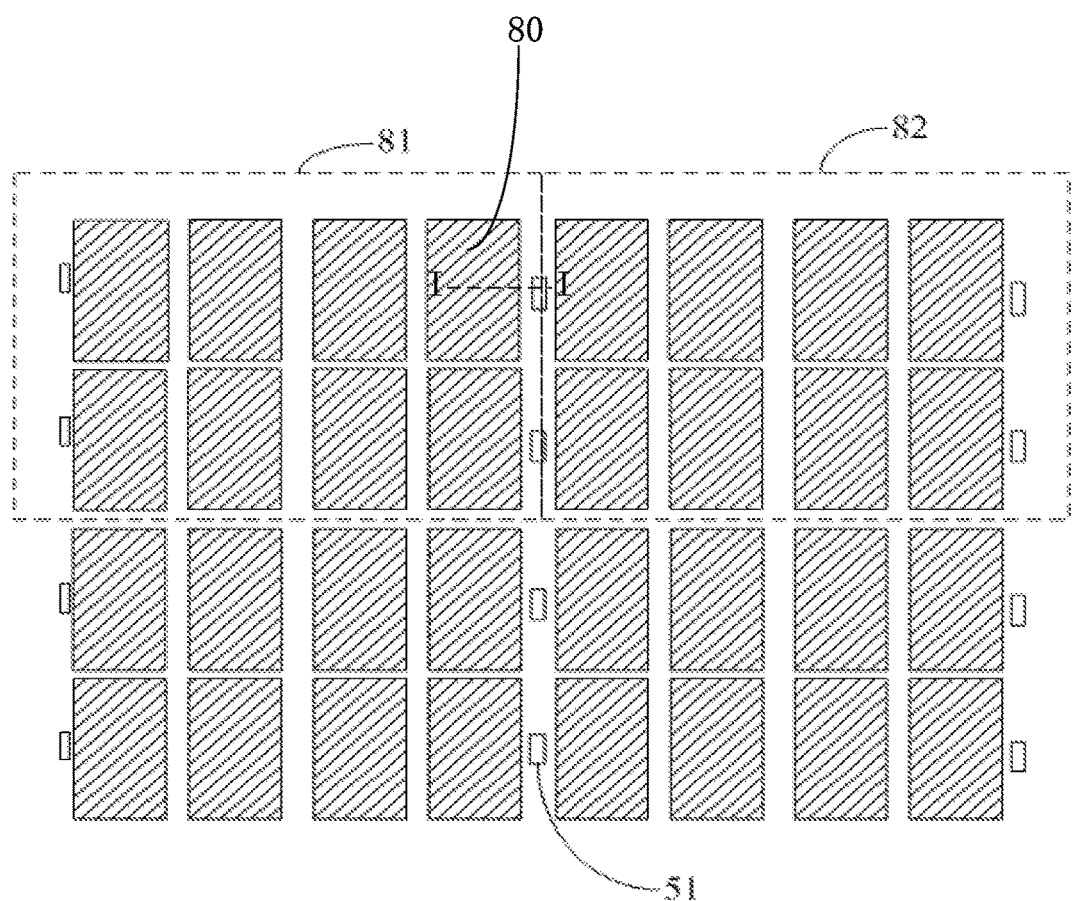
FIG. 8 is a schematic diagram of distribution of a first protruding portion included by the substrate provided by the embodiments of the present disclosure.

FIG. 8 is a schematic diagram of distribution of the first protruding portion included by the substrate provided by the embodiments of the present disclosure. As shown in FIG. 8, for example, the mask 61 as shown in FIG. 6(a) is adopted to expose different regions of the substrate, and exposure is performed four times totally. The units 80 formed by the first exposure 81 and the units 80 formed by the second exposure 82 are arranged in a row direction, and the first protruding portions 51 are arranged in a column direction. The embodiments of the present disclosure do not include a case that patterns are not formed near the cutting position because exposure is shielded; and due to the first protruding portion 51, the stress accumulation near the cutting position is well reduced, and the peripheral defect of the display panel is reduced.

As shown in FIG. 8, the first protruding portions 51 are symmetrically arranged; due to such symmetrical design, a purpose of saving an occupied area is achieved, and thus the peripheral defect of the display panel is reduced while maximum and effective utilizing of the substrate are met.

As shown in FIG. 8, the at least two adjacent units 80 are arranged in the row direction; and as an example, only one first protruding portion 51 is arranged in the cutting region between the at least two adjacent units 80. However, the embodiments of the present disclosure are not limited thereto. For example, in the cutting region between the at least two adjacent units 80, a plurality of first protruding portions 51 are arranged, and the plurality of first protruding portions 51 are arranged in the column direction. In this way, the stress accumulation near the cutting position is well reduced, and the peripheral defect of the display panel is reduced.

As mentioned above, the first protruding portion 51 is formed at the position of the substrate overlapping the exposure gap measure window 611 during the first exposure 81, and the exposure gap measure window 611 (which coincides with the position of the exposure gap measure window 611 on the right side of the mask adopted during the first exposure 81) on the left side of the mask adopted during the second exposure 82 is shielded. In this way, during the second exposure 82, the first protruding portion 51 is not repeatedly formed at the position where the first protruding portion 51 has been arranged. Thus, all of the first protruding portions 51 are equal in height over the entire substrate. In this way, height uniformity of the plurality of first protruding portions 51 on the substrate is maintained.

FIG. 7 is a sectional view taken along a I-I line of FIG. 8. For example, referring to FIG. 7 and FIG. 8, each of the at least two adjacent units 80 includes a display region; and the spacer 34 is located in the display region. For example, the first protruding portion 51 and the spacer 34 are arranged in a same layer and formed with a same material so as to simplify a manufacturing process of the substrate. What needs to be explained is, "the first protruding portion 51 and the spacer 34 are arranged in the same layer and formed with the same material" refers to that a same mask is adopted for pattern a same film (such as a same photoresist film) so as to form the first protruding portion 51 and the spacer 34 simultaneously by a single photolithography process.

For example, referring to FIG. 7 and FIG. 8, each of the at least two adjacent units 80 further includes a sealing region located outside the display region and an intermediate region located between the display region and the sealing region; and the substrate further comprises a second protruding portion 33, arranged on the base substrate 50 and located in the intermediate region. The second protruding portion 33 also plays a supporting role, thereby further reducing the cutting stress accumulation of the display panel and reducing the peripheral defect of the display panel. For example, the first protruding portion 51, the spacer 34 and the second protruding portion 33 are arranged in a same layer and formed with a same material so as to simplify the manufacturing process of the substrate. "The first protruding portion 51, the spacer 34 and the second protruding portion 33 are arranged in the same layer and formed with the same material" refers to that a same mask is adopted for patterning a same film (for example, a same photoresist film) so as to form the first protruding portion 51, the spacer 34 and the second protruding portion 33 simultaneously by a single photolithography process.

For example, referring to FIG. 7 and FIG. 8, the black matrix 39 includes a first portion and a second portion; the first portion of the black matrix and the color filter are located between the base substrate 50 and the spacer 34; and the second portion of the black matrix 39 is located between the base substrate 50 and the second protruding portion 33. The second portion of the black matrix 39 is arranged in the intermediate region or in both of the intermediate region and the sealing region, and light leaking at edges of the display panel is prevented.

For example, the mask exposing the substrate is a single-tone mask, and therefore the first protruding portion 51, the spacer 34 and the second protruding portion 33 have a same thickness in a direction perpendicular to the base substrate 50. In this case, due to the black matrix 39 and the color filter as mentioned above, a distance from an end portion of the first protruding portion 51 away from the base substrate 50 to the base substrate 50, a distance from an end portion of the spacer 34 away from the base substrate 50 to the base substrate 50, and a distance from an end portion of the second protruding portion 33 away from the base substrate 50 to the base substrate 50 are different from one another. Furthermore, the distance from the end portion of the first protruding portion 51 away from the base substrate 50 to the base substrate 50 is smaller than the distance from the end portion of the second protruding portion 33 away from the base substrate 50 to the base substrate 50, and the distance from the end portion of the second protruding portion 33 away from the base substrate 50 to the base substrate 50 is smaller than the distance from the end portion of the spacer 34 away from the base substrate 50 to the base substrate 50. In this case, the spacer 34, the first protruding portion 55 and the second protruding portion 33 are formed in a simpler process.

For example, the mask exposing the substrate is a dual-tone mask, so that the first protruding portion 51, the spacer 34 and the second protruding portion 33 respectively have different heights in the direction perpendicular to the base substrate 50. In this case, even though the black matrix 39 and the color filter as mentioned above are arranged, the distance from the end portion of the first protruding portion 51 away from the base substrate 50 to the base substrate 50, the distance from the end portion of the spacer 34 away from the base substrate 50 to the base substrate 50, and the distance from the end portion of the second protruding portion 33 away from the base substrate 50 to the base substrate 50 are same with one another. In this case, uniformity of the supporting force is further improved.

Figure 9:
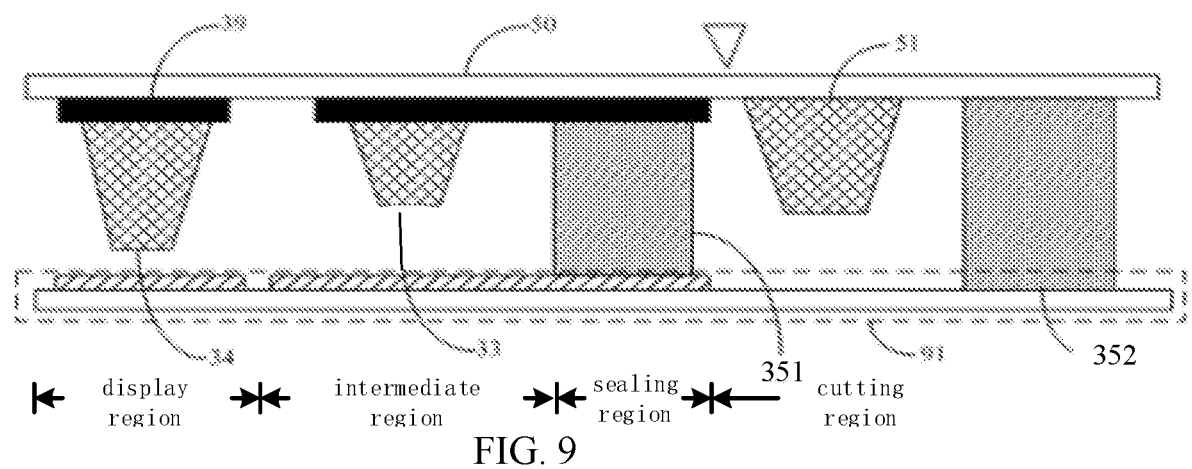
FIG. 9 is a structural schematic diagram obtained during the display panel provided by the embodiments of the present disclosure is cut.

The embodiments of the present disclosure further provide a display panel, and the display panel comprises the substrate provided by the embodiments of the present disclosure. As shown in FIG. 9, the display panel in the embodiments of the present disclosure comprises the substrate provided by the embodiments of the present disclosure, an opposed substrate 91 arranged facing to the substrate, a liquid crystal layer (not shown) and the spacer 34 located between the substrate and the opposed substrate 91, and the sealant 351 sealing the opposed substrate 91 and the substrate. For example, the opposed substrate 91 is an array substrate. For example, the substrate provided by the embodiments of the present disclosure comprises the base substrate 50, the black matrix 39, the spacer 34 and the first protruding portion 51 located on the base substrate 50. An arrow in FIG. 9 shows the cutting position of the display panel. For example, the substrate provided by the embodiments of the present disclosure further comprises the color filter, referring to FIG. 7.

During the display panel in the embodiments of the present invention is cut, as shown in FIG. 9, the first protruding portion 51 plays the supporting role, thereby reducing the stress accumulation near the cutting position of the display panel and reducing the peripheral defect of the display panel.

For example, referring to FIG. 8 and FIG. 9, each of at least two adjacent units 80 includes the display region and the sealing region located outside the display region, and the sealant 351 is arranged in the sealing region. For example, referring to FIG. 8 and FIG. 9, the display panel further comprises an auxiliary sealant 352, located in a cutting region, and the first protruding portion 51 is located between the sealant 351 and the auxiliary sealant 352. The auxiliary sealant 352 is arranged so as to further provide the supporting force, and thus the stress accumulation near the cutting position of the display panel is further reduced and the peripheral defect of the display panel is further reduced. For example, the sealant 351 and the auxiliary sealant 352 are arranged in a same layer and formed with a same material so as to simplify a manufacturing process of the display panel. For example, "the sealant 351 and the auxiliary sealant 352 are arranged in the same layer and formed with the same material" refers to that the sealant 351 and the auxiliary sealant 352 are formed at the same time through a same coating process and a same curing process.

For example, the display panel according to the embodiments of the present disclosure is a mother board, a plurality of sub-boards are obtained after cutting, one unit 80 corresponds to one sub-board, and one sub-board serves as a display screen.

The embodiments of the present disclosure further provides a display device, and the display device comprises the display panel provided by the embodiments of the present disclosure. The display device for example is a mobile phone, a tablet personal computer, a liquid crystal TV set, an organic light emitting diode (OLED), a TV set, a notebook computer, a digital photo frame, a navigator and any product or part with a display function.

The embodiments of the present disclosure further provide a manufacturing method of a substrate. The method is used for manufacturing the substrate as mentioned above according to the embodiments of the present disclosure. For example, the substrate comprises the base substrate 50, the substrate comprises the plurality of units 80, and the cutting region is arranged between at least two adjacent units 80. The method comprises: adopting the mask 61 to expose the substrate so as to form the first protruding portion 51 at the position of the base substrate 50 overlapping the position of exposure gap measure windows 611 of the mask 61, and the first protruding portion 51 is located in the cutting region. In the technique as shown in FIG. 1 and FIG. 2, the exposure gap measure window 21 is only used for measuring the distance between the mask and the substrate. However, in the embodiments according to the present disclosure, the exposure gap measure window 611 is further used for forming the first protruding portion 51 besides being used for measuring the distance between the mask and the substrate. The first protruding portion 51 plays the supporting role, thereby reducing the stress accumulation near the cutting position of the display panel, and reducing the peripheral defect of the display panel.

For example, referring to FIG. 6(b), FIG. 7 and FIG. 8, each of the at least two units 80 includes the display region; and the mask 61 includes the spacer window 613. The method comprises: adopting the mask 61 to expose the substrate so as to form the spacer 34 and the first protruding portion 51 on the base substrate 50 at the same time, and a position of the spacer 34 overlaps that of the spacer window 613 and the spacer 34 is located in the display region. For example, the base substrate 50 is coated with a layer of photoresist, the mask 61 is adopted to expose the layer of photoresist, and then developing is performed so as to form the spacer 34 and the first protruding portion 51 on the base substrate 50 at the same time. In this way, the first protruding portion 51 is formed while the spacer 34 is formed so as to simplify the manufacturing process.

For example, referring to FIG. 6(b), FIG. 7 and FIG. 8, each of the at least two units 80 further includes the sealing region located outside the display region and the intermediate region located between the display region and the sealing region; the mask 61 includes a second protruding portion window 614; the method comprises: adopting the mask 61 to expose the substrate so as to form the spacer 34, the first protruding portion 51 and the second protruding portion 33 on the base substrate 50 at the same time, a position of the second protruding portion 33 overlaps that of the second protruding portion window 614 and the second protruding portion 33 is located in the intermediate region. For example, the base substrate 50 is coated with the layer of photoresist, the mask 61 is adopted to expose the layer of photoresist, and then developing is performed so as to form the spacer 34, the first protruding portion 51 and the second protruding portion 33 on the base substrate 50 at the same time. In this way, the first protruding portion 51 and the second protruding portion 33 are formed while the spacer 34 is formed so as to simplify the manufacturing process. The second protruding portion 33 also plays the supporting role, thereby reducing the stress accumulation near the cutting position of the display panel, and reducing the peripheral defect of the display panel.

For example, referring to FIG. 6(b), FIG. 7 and FIG. 8, the method further comprises: forming the black matrix 39 and the color filter on the base substrate 50, and the black matrix 39 includes the first portion and the second portion; the first portion of the black matrix 39 and the color filter are located between the base substrate 50 and the spacer 34; and the second portion of the black matrix 39 is located between the base substrate 50 and the second protruding portion 33.

For example, the mask for exposing the substrate is the single-tone mask, and therefore the first protruding portion 51, the spacer 34 and the second protruding portion 333 have a same thickness in the direction perpendicular to the base substrate 50. In this case, due to the black matrix 39 and the color filter as mentioned above, the distance from the end portion of the first protruding portion 51 away from the base substrate 50 to the base substrate 50, the distance from the end portion of the spacer 34 away from the base substrate 50 to the base substrate 50, and the distance from the end portion of the second protruding portion 33 away from the base substrate 50 to the base substrate 50 are different from one another. Furthermore, the distance from the end portion of the first protruding portion 51 away from the base substrate 50 to the base substrate 50 is smaller than the distance from the end portion of the second protruding portion 33 away from the base substrate 50 to the base substrate 50, and the distance from the end portion of the second protruding portion 33 away from the base substrate 50 to the base substrate 50 is smaller than the distance from the end portion of the spacer 34 away from the base substrate 50 to the base substrate 50. In this case, the spacer 34, the first protruding portion 55 and the second protruding portion 33 are formed in a simpler process. Because the mask for exposing the substrate is the single-tone mask, light transmittance of the exposure gap measure window 611, light transmittance of the spacer window 613 and light transmittance of the second protruding portion window 614 are same with one another, and for example, the light transmittance is about 100%.

For example, the mask for exposing the substrate is the dual-tone mask, so that the first protruding portion 51, the spacer 34 and the second protruding portion 33 respectively have different heights in the direction perpendicular to the base substrate 50. In this case, even though the black matrix 39 and the color filter as mentioned above exist, the distance from the end portion of the first protruding portion 51 away from the base substrate 50 to the base substrate 50, the distance from the end portion of the spacer 34 away from the base substrate 50 to the base substrate 50, and the distance from the end portion of the second protruding portion 33 away from the base substrate 50 to the base substrate 50 are same with one another. In this case, uniformity of the supporting force is further improved. In order to achieve the structure, for example, the light transmittance of the exposure gap measure window 611 is larger than the light transmittance of the second protruding portion window 614, and the light transmittance of the second protruding portion window 614 is larger than the light transmittance of the spacer window 34.

The foregoing embodiments merely are exemplary embodiments of the disclosure, and not intended to define the scope of the disclosure, and the scope of the disclosure is determined by the appended claims.

The invention claimed is:

1. A substrate, comprising,
a base substrate;
a plurality of units, a cutting region being between at least two adjacent units, each of the at least two adjacent units including a display region, a sealing region outside the display region, and an intermediate region between the display region and the sealing region;
a first protruding portion on the base substrate and in the cutting region;
a second protruding portion in an intermediate region between the display region and the sealing region on the base substrate;
a spacer in the display region on the base substrate;
a sealant in the sealing region;
an auxiliary sealant in the cutting region;
a black matrix on the base substrate; and
a color filter on the black matrix on the base substrate;
wherein the first protruding portion, the second protruding portion and the spacer are in a same layer and formed with a same material, a position of the first protruding portion is located between the sealant and the auxiliary sealant and directly on the base substrate and corresponds to a position of an exposure gap measure window of a mask, a position of the second protruding portion is located on the black matrix, and corresponds to a position of a second protruding portion window, a position of the spacer is located on the color filter, and the first protruding portion and the second protruding portion are configured to reduce the stress accumulation near a cutting position and peripheral defects of a display panel including the substrate; and wherein a distance from an end portion of the first protruding portion away from the base substrate to the base substrate, a distance from an end portion of the spacer away from the base substrate to the base substrate, and a distance from an end portion of the second protruding portion away from the base substrate to the base substrate are different from each other.

2. The substrate according to claim 1, wherein the black matrix includes a first portion and a second portion, wherein
the first portion of the black matrix and the color filter are between the base substrate and the spacer in a direction perpendicular to the base substrate; and
the second portion of the black matrix is between the base substrate and the second protruding portion in the direction perpendicular to the base substrate.

3. The substrate according to claim 1, wherein
the at least two adjacent units are arranged in a row direction; and
a plurality of the first protruding portions are arranged in the cutting region between the at least two adjacent units, and the plurality of first protruding portions are arranged in a column direction.

4. The substrate according to claim 1, wherein a height of the first protruding portion is 3.6 microns to 3.8 microns.

5. The substrate according to claim 1, wherein the first protruding portion is transparent.

6. The substrate according to claim 1, wherein a material of the first protruding portion is a photosensitive material.

7. A display panel, comprising:
a substrate, wherein the substrate comprises:
a base substrate;
an opposed substrate opposite to the base substrate;
a plurality of units, a cutting region being between at least two adjacent units, each of the at least two adjacent units including a display region, a sealing region outside the display region, and an intermediate region between the display region and the sealing region;
a first protruding portion on the base substrate and in the cutting region;
a second protruding portion in an intermediate region between the display region and the sealing region on the base substrate;
a spacer in the display region on the base substrate;
a sealant in the sealing region between the substrate and the opposed substrate and bonding the substrate with the opposed substrate;
an auxiliary sealant in the cutting region;
a black matrix on the base substrate; and
a color filter on the black matrix on the base substrate;
wherein the first protruding portion, the second protruding portion and the spacer are in a same layer and formed with a same material, a position of the first protruding portion is located between the sealant and the auxiliary sealant and directly on the base substrate and corresponds to a position of an exposure gap measure window of a mask, a position of the second protruding portion is located on the black matrix and corresponds to a position of a second protruding portion window, a position of the spacer is located on the color filter, and the first protruding portion and the second protruding portion are configured to reduce the stress accumulation near a cutting position and peripheral defects of a display panel including the substrate; and wherein a distance from an end portion of the first protruding portion away from the base substrate to the base substrate, a distance from an end portion of the spacer away from the base substrate to the base substrate, and a distance from an end portion of the second protruding portion away from the base substrate to the base substrate are different from each other.

8. The display panel according to claim 7, wherein the sealant and the auxiliary sealant are arranged in a same layer and formed with a same material.

9. The display panel according to claim 7, wherein the at least two adjacent units are arranged in a row direction; and
a plurality of the first protruding portions are arranged in the cutting region between the at least two adjacent units, and the plurality of first protruding portions are arranged in a column direction.

10. The display panel according to claim 7, wherein a height of the first protruding portion is 3.6 microns to 3.8 microns.

11. The display panel according to claim 7, wherein the first protruding portion is transparent.

12. The display panel according to claim 7, wherein a material of the first protruding portion is a photosensitive material.

13. A preparation method of a substrate, the substrate comprising a base substrate, and a plurality of units, a cutting region being provided between at least two adjacent units, each of the at least two adjacent units including a display region, a sealing region outside the display region, and an intermediate region between the display region and the sealing region; a sealant in the sealing region; and an auxiliary sealant in the cutting region;
the method comprises: adopting a mask includes a spacer window to expose the substrate so as to form a first protruding portion at a position of the base substrate corresponding to a position of an exposure gap measure window of the mask, and the first protruding portion is formed in the cutting region and located between the sealant and the auxiliary sealant and directly on the base substrate;

forming a black matrix and a color filter on the black matrix on the base substrate;

adopting the mask to expose the substrate so as to form a spacer on the color filter, and the first protruding portion between the sealant and the auxiliary sealant and directly on the base substrate at the same time, a position of the spacer corresponds to a position of the spacer window and the spacer is in the display region; and adopting the mask to expose the substrate so as to form the spacer on the color filter, the first protruding portions and a second protruding portion on the base substrate at the same time, a position of the second protruding portion corresponds to a position of the second protruding portion window and the second protruding portion is in the intermediate region and located on the black matrix;

wherein the first protruding portion, the second protruding portion and the spacer are formed in a same layer and with a same material, and the first protruding portion and the second protruding portion are configured to reduce the stress accumulation near a cutting position and peripheral defects of a display panel including the substrate; and wherein a distance from an end portion of the first protruding portion away from the base substrate to the base substrate, a distance from an end portion of the spacer away from the base substrate to the base substrate, and a distance from an end portion of the second protruding portion away from the base substrate to the base substrate are different from each other.

14. The method according to claim 13, wherein the mask includes a second protruding portion window.

15. The method according to claim 14, wherein the black matrix includes a first portion and a second portion, wherein the first portion of the black matrix and the color filter are between the base substrate and the spacer; and
the second portion of the black matrix is between the base substrate and the second protruding portion.

16. The method according to claim 15, wherein a light transmittance of the exposure gap measure window, a light transmittance of the spacer window and a light transmittance of the second protruding portion window are same as each other.

17. The method according to claim 15, wherein a light transmittance of the exposure gap measure window is larger than a light transmittance of the second protruding portion window, and the light transmittance of the second protruding portion window is larger than the light transmittance of the spacer window.

* * * * *